United States Patent [19]
LaMacchia et al.

[11] Patent Number: 5,600,260
[45] Date of Patent: Feb. 4, 1997

[54] METHOD AND APPARATUS FOR HARDENING CURRENT STEERING LOGIC TO SOFT ERRORS

[75] Inventors: Michael P. LaMacchia, Gilbert; William O. Mathes, Tempe, both of Ariz.

[73] Assignee: Motorola, Inc., Schaumburg, Ill.

[21] Appl. No.: 496,651

[22] Filed: Jun. 29, 1995

[51] Int. Cl.$^6$ .......................... H03K 19/003; H03K 19/00
[52] U.S. Cl. .................... 326/11; 326/10; 326/31; 326/127
[58] Field of Search ...................... 326/9–11, 12, 326/14, 115, 113, 125–127, 21, 31

[56] References Cited

U.S. PATENT DOCUMENTS

| | | | |
|---|---|---|---|
| 3,818,243 | 6/1974 | McMahon | 326/12 |
| 4,593,249 | 6/1986 | Arita et al. | 326/10 |
| 4,617,475 | 10/1986 | Reinschmidt | 326/11 |
| 4,621,201 | 11/1986 | Amdahl et al. | 326/14 |
| 5,436,572 | 7/1995 | Sugiyama | 326/12 |

*Primary Examiner*—Edward P. Westin
*Assistant Examiner*—Jon Santamauro
*Attorney, Agent, or Firm*—Bradley J. Botsch, Sr.; Jeffrey Nehr

[57] ABSTRACT

A method and apparatus for hardening current steering logic (CSL) to soft errors (charged particles passing through and upsetting the logic state of an integrated circuit) includes a hardened CSL circuit or cell (20), including three or more circuit cell elements (21) in parallel. The circuit cell elements (21) redundantly perform a single cell function. Each of the circuit cell elements (21) is coupled to soft error immune resistive elements (24 and 25) within a summing element (22). Current (23) is steered through the resistive elements (24 and 25) depending upon input signals (26) to each of the circuit cell elements (21). The logical output signal (27) is unaffected by a single soft error event since the majority of the total current (23) remains steered through the correct resistive element (24 or 25).

12 Claims, 3 Drawing Sheets

METHOD AND APPARATUS FOR HARDENING CURRENT STEERING LOGIC TO SOFT ERRORS

FIELD OF THE INVENTION

This invention relates in general to the field of hardening of electronic circuits to soft errors, and in particular to the hardening of current steering logic in a logic cell.

BACKGROUND OF THE INVENTION

Soft errors become a problem in integrated circuits as circuit bandwidths increase. A soft error occurs when particles passing through the integrated circuit deposit enough charge to upset the logic state of the circuit. The susceptibility of high speed circuits to soft errors is due to the very fast nature of the soft error event. The time scale for the deposition of the charge is typically about 50 picoseconds to 3 nanoseconds. Given the very brief event period, slower technologies cannot react to soft errors and are considered insensitive.

Most high speed logic is implemented in current steering logic (CSL). CSL implements Boolean functions by steering a current through differential transistor pairs to develop a differential output voltage across resistive devices, and incorporates current amplifiers, such as source or emitter followers, when increased drive capability is needed. CSL is the basis for silicon emitter-coupled logic (ECL) and current mode logic (CML), gallium arsenide (GaAs) source coupled FET logic (SCFL), some GaAs hetero-structure bipolar transistor (HBT) circuits, and can be found in other semiconductors and associated logic implementations.

Conventional soft error hardening approaches rely upon system level triple modular redundancy coupled with voting logic circuitry. A shortcoming of system level triple modular redundancy is the greater than 300% increase in complexity and power as well as increases in size and weight required in order to provide the hardening function. Furthermore, existing systems which require soft error hardening would typically need extensive redesign for the implementation of system level triple modular redundancy.

SUMMARY OF THE INVENTION

Accordingly, it is an advantage of the present invention to provide a method and apparatus to obtain the same level of soft error hardening in CSL circuits, as compared to system level triple redundancy hardening approaches, with only a relatively small power increase, and without the added complexity of voting logic circuitry. Furthermore, it is an advantage that the present invention is implemented within an integrated circuit to allow "drop-in" replacement requiring little, if any, system modification. In addition, it is also an advantage that the present invention requires no integrated circuit (IC) fabrication process modifications, and therefore can be widely applied to existing commercial IC processes.

To achieve these advantages, an apparatus is contemplated which achieves soft error hardening of a CSL cell through functional redundancy at the transistor level by including three or more functionally equivalent circuit cell elements in parallel. The multiple circuit cell elements replace the single circuit cell element in the unhardened CSL cell. Soft error immune resistive devices are used in the summing element. If the cell is clocked, three or more clock distribution circuits can be used for clock hardening. The function of the multiple circuit cell elements is such that a single soft error is not sufficient to cause a logic error in the cell output.

To further achieve the advantages above, a method for the design of a soft error hardened CSL cell is contemplated, the method including the steps of replacing a single circuit cell element with three or more parallel circuit cell elements, narrowing the widths of the transistors in the circuit cell element to decrease power, providing sufficient isolation between parallel circuit cell elements so that a single particle can not affect more than one, providing sufficient current in the parallel circuit cell elements to propagate correct data even when affected by a soft error, replacing the resistive devices in the summing element with soft error immune resistive devices (if not already immune), and providing three or more clock distribution circuits.

The above and other features and advantages of the present invention will be better understood from the following detailed description taken in conjunction with the accompanying drawings.

DETAILED DESCRIPTION OF THE DRAWINGS

Figure 1:
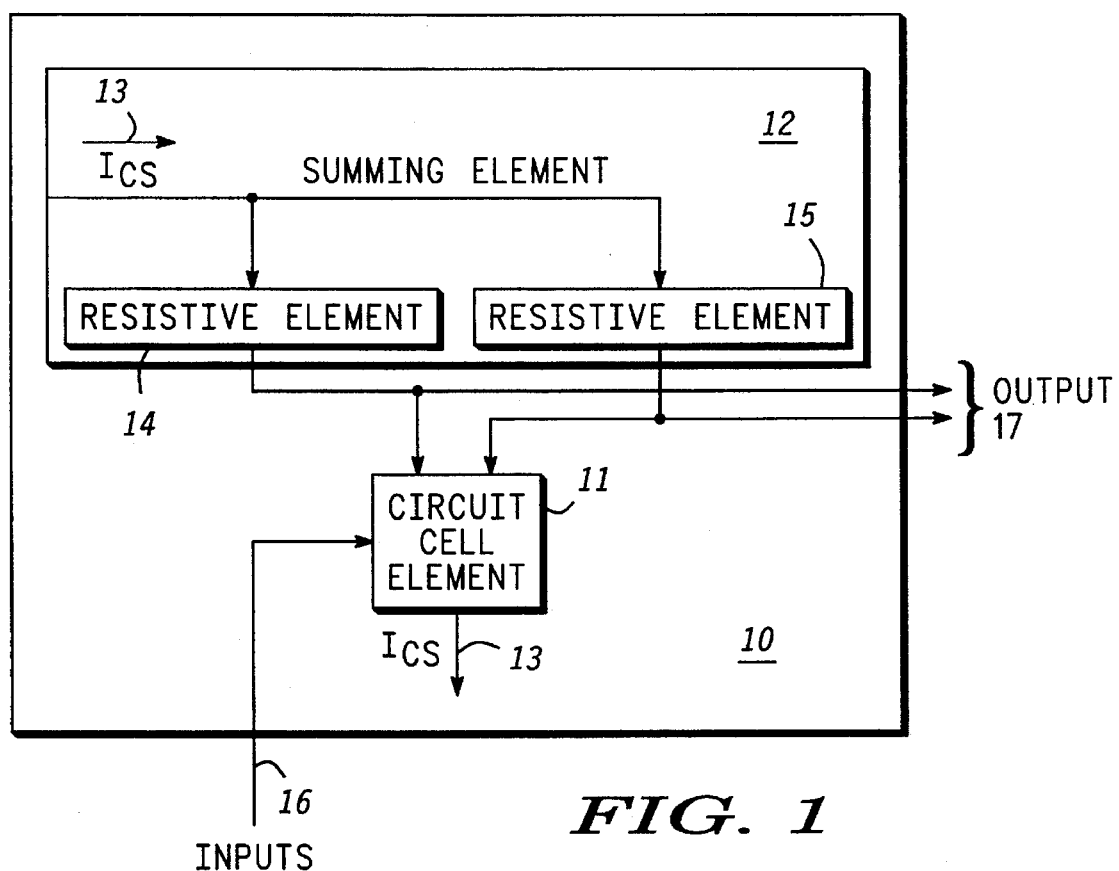
In FIG. 1, there is shown a schematic diagram of an unclocked, unhardened CSL cell.

A schematic diagram of an unclocked unhardened CSL cell 10 is shown in FIG. 1 in order to define terms for cell elements which will be relevant to the following discussions. The CSL cell 113 in FIG. 1 is divided into the circuit cell element 11 and the summing element 12. The circuit cell element 11 steers fixed and constant current, $I_{cs}$ 13, through either resistive element 14 or resistive element 15 in the summing element 12 to develop output voltages 17 which represent the logic function the circuit cell element 11 performs on the inputs 16. The circuit cell element 11 can also contain current amplifying output signals if increased output drive is needed in the CSL cell 10. $I_{cs}$ 13 flows out of the circuit cell element 11.

Figure 2:
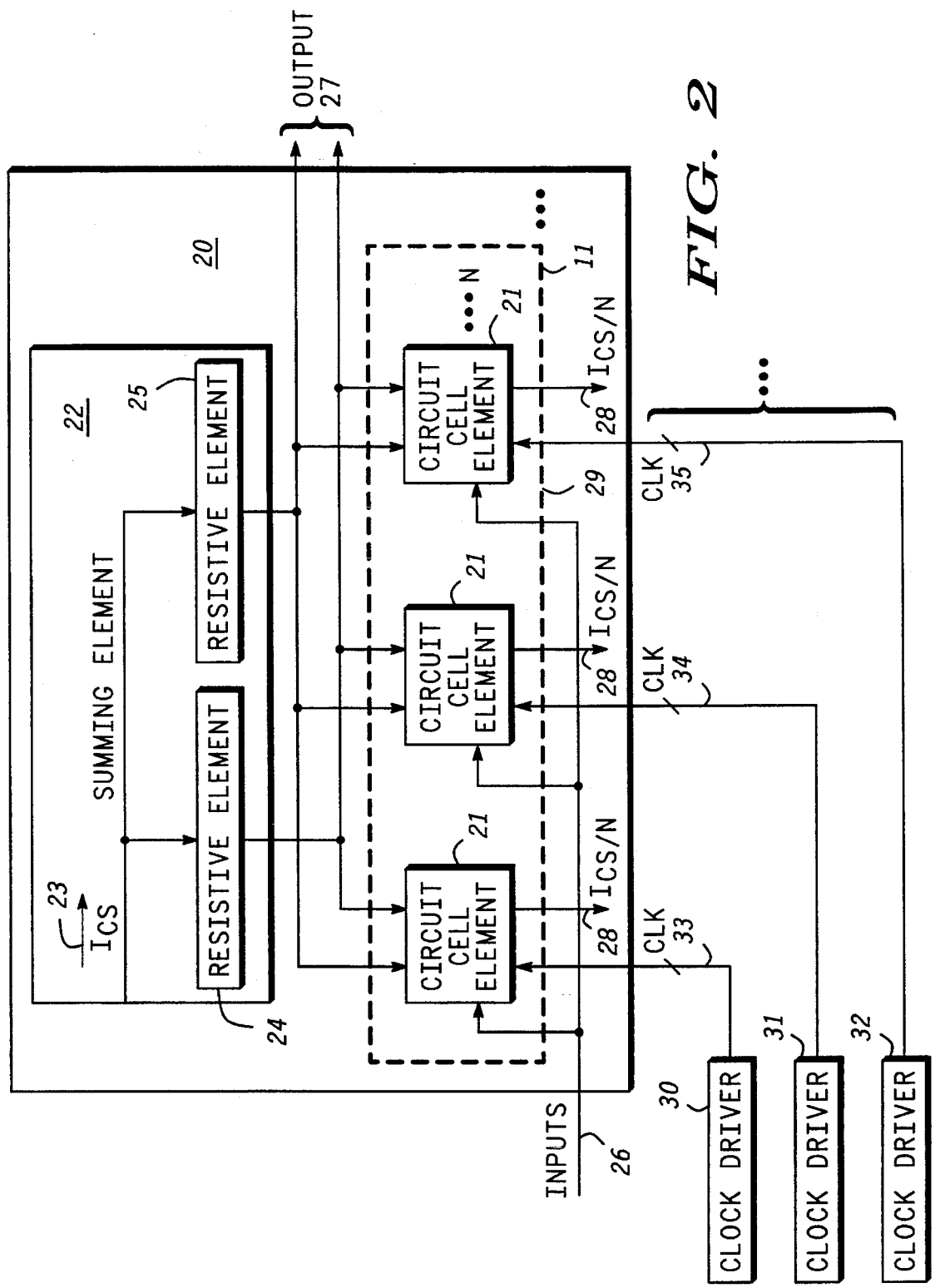
In FIG. 2, there is shown a schematic diagram of a hardened clocked CSL cell with multiple clock drivers in accordance with preferred embodiments of the present invention; and In FIG. 3, there is shown a schematic diagram of a partially hardened CSL cell in accordance with preferred embodiments of the present invention.

In FIG. 2, there is shown a schematic diagram of a hardened CSL cell 20 in accordance with preferred embodiments of the present invention. FIG. 2 includes three or more circuit cell elements 21 in parallel. The circuit cell elements 21 can be viewed as three or more elements redundantly performing a single cell function or a partitioned single cell, wherein the partitioned portions redundantly perform the functions of the single cell. Each of the three or more circuit cell elements 21 is coupled to both resistive element 24 and resistive element 25 within summing element 22. The combination of the three or more circuit cell elements and summing element comprise a single logic cell. Resistive elements 24 and 25 are two soft error immune devices. Current $I_{cs}$ 23 is steered through resistive elements 24 or 25 depending upon inputs 26 to each of the three or more circuit cell elements 21. The three or more circuit cell elements 21 in parallel in the hardened cell perform the same logic function as the single circuit cell element replaced while hardening the cell. If the CSL cell is clocked, each of the three or more circuit cell elements 21 is driven by a separate clock driver 30, 31, and 32 as shown in FIG. 2.

The total cell current, $I_{cs}$ 23, is evenly divided between each of the three or more circuit cell elements 21. If there are "n" circuit cell elements 21, each of the circuit cell elements 21 receives $I_{cs}/n$ 28 of current. Note that, if the current in one of the three or more circuit cell elements 21 is incorrectly steered through the wrong resistive device 24 or 25 due to a soft error in that circuit cell element 21, a majority of the total current in the three or more circuit cell elements 21 is still steered through the correct resistive device 24 or 25. If appropriate design methods are followed in the design of the hardened cell, the difference in the magnitude of the currents will be sufficient to pass correct data to the load. Thus, with the single soft error occurring, the logical output signal 27 resulting remains the same as if the single soft error had not occurred while the hardened CSL cell 20 was processing input signals 26.

The hardening of a CSL cell 20 in such a manner as illustrated in FIG. 2 can be achieved with considerably less complexity, circuit area, and power requirements compared to simply providing triple redundancy and voting circuitry to provide hardening against soft errors. For example, the current in each of the three or more circuit cell elements 21 in the representation in FIG. 2 can be significantly less than the current in the circuit cell element 11 in FIG. 1 which is replaced; therefore, the cell power consumption increase due to the hardened implementation can be significantly less than three times the original cell power. Moreover, the electrical power consumed by the three or more circuit cell elements embodiment is less than a total electrical power consumed by a triple modular redundant soft error hardened circuit of equivalent function.

When current amplifying output drivers are required in the CSL cell 20 for increased drive capability, the output drivers can be hardened by including a separate output driver in each of the three or more circuit cell elements 21 of the hardened cell. However, output drivers are typically less sensitive to soft errors compared to the sensitivity of differential transistor pairs. Therefore, hardening of the output drivers may not be needed to achieve the soft error requirements for a particular application.

In clocked CSL circuits, a clock circuit can be hardened by utilizing separate clock drivers to distribute clock signals to each of the three or more circuit cell elements 21 in the hardened CSL cells. FIG. 2 illustrates clock drivers 30, 31, and 32 providing clock inputs CLK 33, CLK 34, and CLK 35 to successive circuit cell elements 21. As shown in FIG. 2, there can be a separate clock driver for each of the separate circuit cell elements (assigned on a one-to-one basis). Clock drivers 30, 31, and 32 can be used to provide such clock inputs to additional hardened CSL cells 20 that contain three circuit cell elements 21.

To properly harden a CSL cell 20 in method terms, one replaces or partitions a single circuit cell element with three or more circuit cell elements with the necessary isolation between each of the multiple circuit cell elements 21. The same transistor voltage biasing is achieved by reducing the width of each transistor in the three or more circuit cell elements 21 from the original width of the corresponding transistor in the single circuit cell element 21 being replaced. The reduction in transistor width reduces net load capacitance, and is possible due to the reduced current in each path of the three or more circuit cell elements 21.

Isolation between the three or more circuit cell elements 21 can be provided by either spacing the three or more circuit cell elements 21 physically far enough away from each other or adding some other type of isolation so that a single particle can cause a soft error in no more than one of the three or more circuit cell elements 21 at a time. The transistor-to-transistor isolation spacing necessary depends on a variety of factors, including the technology utilized. It is probable that the spacing necessary needs to be determined through experimental means to verify that an output signal 27 is unaltered as a result of a soft error to a circuit cell element 21.

A sufficient difference in the voltages developed in the summing element 22 during a soft error (i.e. logic voltage swing) must be created to correctly switch the loads. The total current in the three or more circuit cell elements 21 may have to be greater than the current in the single circuit cell element replaced, depending on the gain of the differential transistor pairs being driven and the noise margin of the original unhardened design. In addition, the current in the three or more circuit cell elements 21 needs to be adjusted to harden for a soft error on a clock distribution circuit, because an error on one of the three or more clock circuits would decrease the output voltage swing of the driving cell and reduce the gain of the acquiring load cell. Furthermore, if the increased parasitic interconnect capacitance which would likely result from the increased complexity of the metal routing of the three or more circuit cell elements 21 is not offset by the reduced gate capacitance of narrower transistors, the resistance of the resistive devices (24,25) would need to be reduced proportionally to the increased capacitance in order to maintain an appropriate output rise time. Accordingly, the total current in the three or more circuit cell elements 21 would need to be increased proportionally to the decrease in the resistive device (24,25) resistance in order to maintain the same output voltage swing.

An increased total current in the three or more circuit cell elements increases the power in the hardened cell 20. However, the increased power necessary to achieve sufficient differential output voltage and to drive the increased interconnect capacitance is relatively small compared to the total cell power provided the cell is implemented so as to minimize the interconnect capacitance.

The preferred embodiments in accordance with the present invention use resistive devices (24,25) which are immune to soft error, e.g., metal resistive devices. Polysilicon and implanted resistive devices can also be used, but they may collect charge from a soft error event which could cause a logical error. Use of active resistive devices, such as diodes, may make the CSL cell susceptible to soft errors and are preferably avoided. The suitability of other resistive types can be determined, but the acceptability of these resistive devices should preferably be confirmed experimentally.

Three or more separate clock circuits with separate clock drivers (30,31,32) can be provided to drive each of the three or more circuit cell elements 21 in hardened clocked CSL cell 20. The number of clock circuits required equals the maximum number of parallel circuit cell elements 21 implemented in the cell being clocked, because each differential clock input in the parallel circuit cell elements 21 needs to be connected to a separate clock distribution.

At least three parallel circuit cell elements 21 (as shown in FIG. 2) are needed to harden a CSL cell 20, but there are two known advantages to implementing more than three. First, with an increasing number of circuit cell elements 21, the difference in the output voltage increases when one of the circuit cell elements 21 is affected by a soft error. Therefore, it would be possible to save power by reducing the total current in the path while still achieving the same CSL cell hardening providing that the increased interconnect capacitance due to the increased number of circuit cell elements 21 is offset by reduced gate capacitance due to a narrower transistors. Second, if a sufficient number of parallel circuit cell elements 21 is implemented, a cell 20 can be hardened to multiple simultaneous soft errors. For example, if five or more circuit cell elements 21 are implemented, the cell 20 can be hardened to two particles hitting two different circuit cell elements 21 in the same cell 20 at the same time, since the logical function of the cell is preserved by the majority of the current in the five circuit cell elements 21 being steered through the correct resistive device (24,25).

Figure 3:
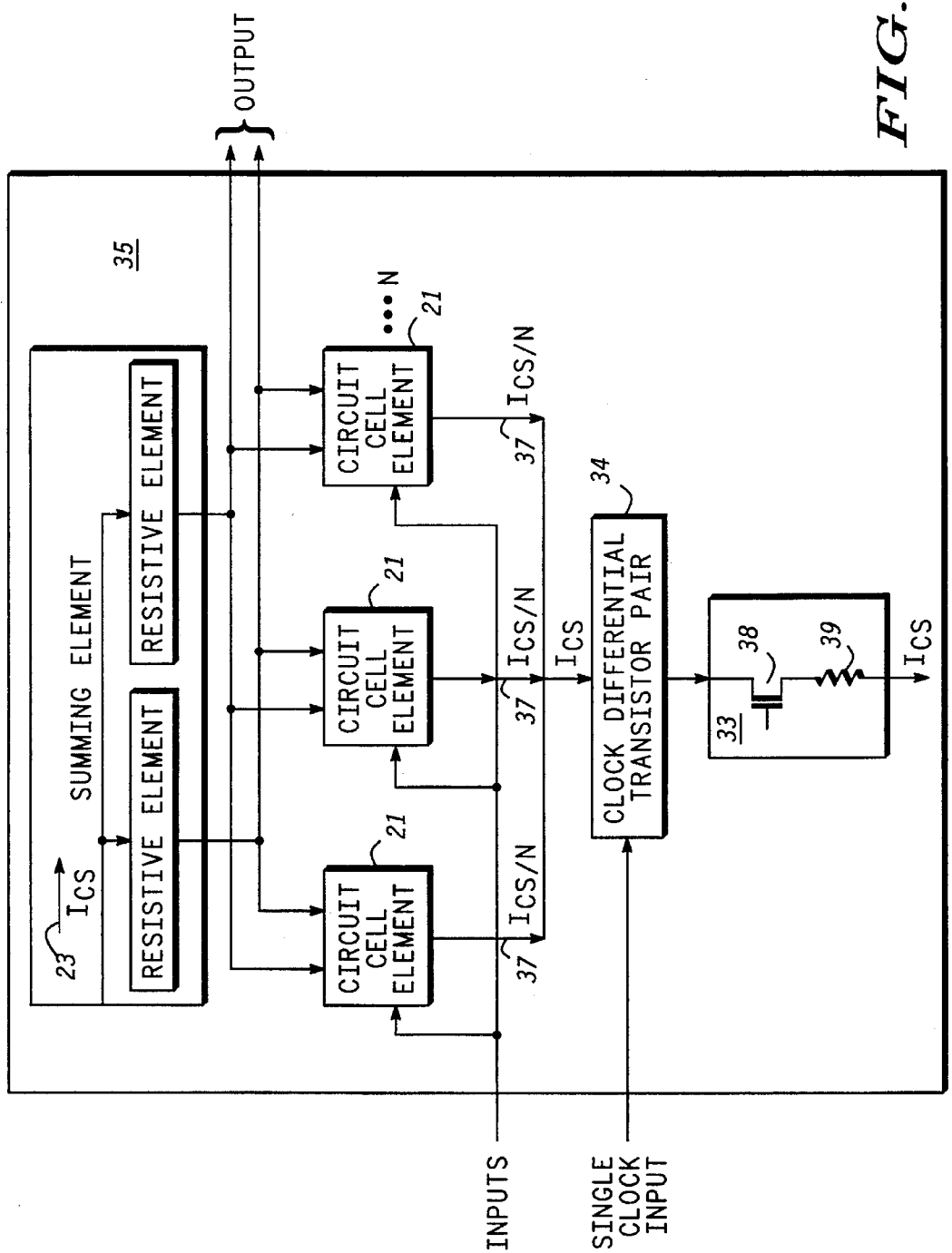

In FIG. 3, there is shown a schematic diagram of a partially hardened CSL cell 35 with a single clock input and a shared current source 33 in accordance with preferred embodiments of the present invention. The FIG. 3 embodiment depicts a hardened cell 35 with the exception of the current source 33 and clock differential transistor pair 34. FIG. 3 illustrates a current source 33 and differential clock transistor pair 34 shared by the circuit cell elements 21, with the current source 33 comprising a transistor 38 and resistor 39. Current $I_{cs}/n$ 37 flows out of each of the circuit cell elements 21 and into the common differential clock transistor pair 34.

Various elements in a hardened cell may be shared by the three or more parallel circuit cell elements 21 to reduce implementation complexity while still achieving some degree of cell hardening. For instance, if the current source 33 implemented in the hardened cell 35 design include a resistor 39 which is immune to the effects of a soft error that resistor 39 can be common to each of the current sources in the circuit cell elements without reducing the hardness of the cell. Furthermore, a single common current source 33 can be shared by the three or more circuit cell elements 21 with only a relatively small decrease in cell hardening. The use of a common current source transistor 38 to all the circuit cell elements would make the cell susceptible to upset. However, the soft error susceptible area of the common current source transistor is much smaller than the susceptible area of a completely unhardened cell, and the cell would remain partially hardened. In addition, if the common current source 33 is used, a single common differential clock transistor pair 31 can also be used to provide a clock function for all of the three or more circuit cell elements 21, as shown in FIG. 3, while still achieving some degree of cell hardening. The implementation shown in FIG. 3 avoids the complexity of three or more clock distributions. As discussed earlier, parallel output drivers can add a degree of circuit hardening, but a standard output driver can have an inherent hardness to soft errors which may make multiple parallel output drivers unnecessary to a given application.

Thus, there has been provided, in accordance with an embodiment of the invention, a method and apparatus for the hardening of CSL cells to soft errors that fully satisfies the aims and advantages set forth above. While the invention has been described in conduction with specific embodiments, many alternatives, modifications, and variations will be apparent to those of ordinary skill in the art in light of the forgoing . description. Accordingly, the invention is intended to embrace all such alternatives, modification, and variations as fall within the spirit and broad scope of the appended claims.

What is claimed is:

1. A current steering logic (CSL) circuit hardened to a soft error, the CSL circuit comprising:

three or more circuit cell elements for receiving input signals wherein each of the three or more circuit cell elements redundantly performs a single circuit cell function on the input signals;

a current source, coupled to the three or more circuit cell elements, for supplying a predetermined current, the predetermined current being equally divided between the three or more circuit cells elements when no soft errors occur: and a summing element coupled to each of the three or more circuit cell elements for providing a predetermined logic signal at an output thereof whereby the predetermined logic signal is maintained in the presence of soft errors occurring in a minority of the three or more circuit cell elements because the equally divided current is maintained in a majority of the three or more circuit cell elements.

2. A CSL circuit as claimed in claim 1, wherein the summing element and the three or more circuit cell elements comprise a single cell.

3. A CSL circuit as claimed in claim 1, wherein the summing element comprises first and second resistive elements.

4. A CSL circuit as claimed in claim 3, wherein each of the first and the second resistive elements are soft error immune devices.

5. A CSL circuit as claimed in claim 1, wherein each of the three or more circuit cell elements comprises a constant current source.

6. A CSL circuit as claimed in claim 1, additionally comprising a single constant current source coupled to each of the three or more circuit cell elements.

7. A CSL circuit as claimed in claim 1, wherein each of the three or more circuit cell elements is coupled one-to-one to separate clock drivers which provide a separate clock signal to each of the three or more circuit cell elements.

8. A CSL circuit as claimed in claim 1, wherein each of the three or more circuit cell elements is coupled to a single clock driver that provides a clock signal to each of the three or more circuit cell elements.

9. A current steering logic (CSL) circuit hardened to a soft error, the CSL circuit comprising:

three or more circuit cell elements for receiving input signals, wherein each of the three or more circuit cell elements is partitioned from a single circuit cell;

a current source, coupled to the three or more circuit cell elements, for supplying a predetermined current, the predetermined current being equally divided between the three or more circuit cells elements when no soft errors occur; and a summing element coupled to each of the three or more circuit cell elements for providing a predetermined logic signal at an output thereof whereby the predetermined logic signal is maintained in the presence of soft errors occurring in a minority of the three or more circuit cell elements because the equally divided current is maintained in a majority of the three or more circuit cell elements.

10. A CSL circuit as claimed in claim 9, wherein electrical power consumed within the three or more circuit cell elements is less than a total electrical power of a triple modular redundant soft error hardened circuit.

11. A CSL circuit as claimed in claim 9, further comprising three or more separate clock distribution circuits coupled to each of the three or more circuit cell elements, wherein the output signal at the summing element is unaltered as a result of the soft error on a single clock distribution circuit.

12. A method for hardening a current steering logic (CSL) circuit to soft errors, the method comprising the steps of:

partitioning a single cell into a plurality of circuit cell elements, wherein each of the plurality of circuit cell elements redundantly performs a logic function of the single supplying current through the plurality of circuit cell elements whereby substantially equal currents flow through each of the plurality of circuit cell elements when no soft errors occur, and summing output currents from the plurality of circuit cell elements to provide a predetermined logic signal whereby the predetermined logic signal is maintained in the presence of soft errors occurring in a minority of the plurality of circuit cell elements because the current flowing through a majority of the plurality of circuit cell elements is maintained.

* * * * *

UNITED STATES PATENT AND TRADEMARK OFFICE
CERTIFICATE OF CORRECTION

PATENT NO. : 5,600,260
DATED : February 4, 1997
INVENTOR(S) : Michael P. LaMacchia et al.

It is certified that error appears in the above-identified patent and that said Letters Patent is hereby corrected as shown below:

In column 7, claim 12, line 9, insert --cell;-- after "single".

Signed and Sealed this

Twenty-third Day of September, 1997

Attest:

BRUCE LEHMAN

Attesting Officer

Commissioner of Patents and Trademarks